United States Patent
Li et al.

(10) Patent No.: US 10,957,643 B2
(45) Date of Patent: Mar. 23, 2021

(54) FORMATION OF SEMICONDUCTOR DEVICES INCLUDING ELECTRICALLY PROGRAMMABLE FUSES

(71) Applicant: INTERNATIONAL BUSINESS MACHINES CORPORATION, Armonk, NY (US)

(72) Inventors: Juntao Li, Cohoes, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/664,003

(22) Filed: Oct. 25, 2019

(65) Prior Publication Data
US 2020/0058588 A1 Feb. 20, 2020

Related U.S. Application Data

(62) Division of application No. 16/040,916, filed on Jul. 20, 2018, now Pat. No. 10,553,535.

(51) Int. Cl.
*H01L 23/525* (2006.01)
*H01L 21/768* (2006.01)
*H01L 21/321* (2006.01)
*H01L 21/288* (2006.01)

(52) U.S. Cl.
CPC ...... *H01L 23/5256* (2013.01); *H01L 21/2885* (2013.01); *H01L 21/32115* (2013.01); *H01L 21/76847* (2013.01); *H01L 21/76886* (2013.01)

(58) Field of Classification Search
CPC .................................. H01L 21/76847
See application file for complete search history.

(56) References Cited

U.S. PATENT DOCUMENTS

| | | |
|---|---|---|
| 3,413,585 A | 11/1968 | Kozacka |
| 4,227,168 A | 10/1980 | Knapp, Jr. |
| 4,228,417 A | 10/1980 | Belcher |
| 4,240,058 A | 12/1980 | Kozacka et al. |
| 4,245,208 A | 1/1981 | Belcher |
| 4,254,394 A * | 3/1981 | Kozacka .............. H01H 85/153 337/231 |
| 4,272,741 A | 6/1981 | Vanderknyff |
| 4,306,212 A | 12/1981 | Belcher |

(Continued)

OTHER PUBLICATIONS

List of IBM Patents or Patent Applications Treated as Related dated Oct. 25, 2019, 2 pages.

(Continued)

*Primary Examiner* — Thao P Le
(74) *Attorney, Agent, or Firm* — Tutunjian & Bitetto, P.C.; James Nock

(57) ABSTRACT

A semiconductor device including an electrically programmable fuse includes a substrate, a first electrode on the substrate, dielectric material on the first electrode, one or more second electrodes including a conductive material disposed on the first electrode between portions of the dielectric material, and one or more voids encapsulated by the conductive material such that the one or more voids have boundaries defined in part by portions of the conductive material corresponding to fuse links disposed between the one or more voids and the dielectric material.

20 Claims, 5 Drawing Sheets

(56) References Cited

U.S. PATENT DOCUMENTS

| | | |
|---|---|---|
| 6,501,107 B1 | 12/2002 | Sinclair et al. |
| 6,754,135 B2 | 6/2004 | Pilo |
| 6,897,543 B1 | 5/2005 | Huang et al. |
| 6,998,865 B2 | 2/2006 | Bard et al. |
| 7,157,782 B1 | 1/2007 | Shih et al. |
| 7,272,067 B1 | 9/2007 | Huang et al. |
| 7,388,273 B2 | 6/2008 | Burr et al. |
| 7,491,585 B2 | 2/2009 | Yang et al. |
| 8,053,809 B2 | 11/2011 | Cheng et al. |
| 8,400,813 B2 | 3/2013 | Lee |
| 9,666,528 B1 | 5/2017 | Bergendahl et al. |
| 10,553,535 B1 | 2/2020 | Li et al. |
| 2010/0032797 A1* | 2/2010 | Takewaki ............ H01L 23/5256 257/529 |
| 2010/0090751 A1 | 4/2010 | Cheng et al. |
| 2011/0074538 A1 | 3/2011 | Wu et al. |
| 2012/0187528 A1 | 7/2012 | Cheng et al. |
| 2016/0172368 A1* | 6/2016 | Pang ................ H01L 27/11582 257/314 |
| 2017/0278794 A1* | 9/2017 | Edelstein .......... H01L 23/53223 |
| 2017/0278795 A1* | 9/2017 | Edelstein ............ H01L 23/5256 |
| 2019/0088646 A1* | 3/2019 | Kim .................... H01L 23/5256 |

OTHER PUBLICATIONS

R. F. Rizzolo et al, "IBM system z9 eFUSE applications and methodology" IBM Journal of Research and Development Jan. 2007 pp. 65-75 vol. 51, Issue: 1.2.

C. Kothandaraman et al. "Electrically Programmable Fuse (eFUSE) Using Electromigration in Silicides" IEEE Electron Device Letters Sep. 2002 pp. 523-525 vol. 23, No. 9 IEEE.

Office Action issued in U.S. Appl. No. 16/663,956 dated Nov. 13, 2020, 24 pages.

* cited by examiner

100

100

FORMATION OF SEMICONDUCTOR DEVICES INCLUDING ELECTRICALLY PROGRAMMABLE FUSES

BACKGROUND

Technical Field

The present invention generally relates to semiconductor devices, and more particularly to semiconductor devices including electrically programmable fuses and methods of forming the same.

Description of the Related Art

Electronic systems often require function to be enabled, disabled, or modified after semiconductor chips used in the electronic systems have been manufactured. For example, a common chip may be designed to serve multiple applications, with the chip originally having circuitry to support all of the multiple applications.

After manufacture of the chip, electrically programmable fuses, or eFuses, can be blown to personalize the chip for a particular specific application. As another example, a chip can be manufactured imperfectly and portions of the chip can be unusable. To prevent use of the unusable portions of the chip, eFuses can be used to store information related to unusability. Uses for eFuses include, but are not limited array redundancy, field programmable arrays, analog component trimming circuits and chip identification circuits.

SUMMARY

In accordance an embodiment of the present invention, a method for fabricating an electrically programmable fuse is provided. The method includes patterning dielectric material formed on a first electrode including a first conductive material to create one or more openings, and forming second conductive material within the one or more openings. Forming the second conductive material includes forming one or more voids encapsulated by the second conductive material such that the one or more voids have boundaries defined in part by portions of the second conductive material disposed between the one or more voids and the dielectric material. The portions of the second conductive material correspond to fuse links.

In accordance with another embodiment of the present invention, a method for fabricating an electrically programmable fuse is provided. The method includes forming a first electrode including a first conductive material on a substrate, forming dielectric material on the first electrode, patterning the dielectric material to create one or more openings, and forming second conductive material within the one or more openings. Forming the second conductive material includes forming one or more voids encapsulated by the second conductive material such that the one or more voids have boundaries defined in part by portions of the second conductive material disposed between the one or more voids and the dielectric material. The portions of the second conductive material correspond to fuse links.

In accordance with yet another embodiment of the present invention, a semiconductor device is provided. The device includes a substrate, a first electrode including a first conductive material on the substrate, dielectric material on the first electrode, one or more second electrodes including a second conductive material disposed on the first electrode between portions of the dielectric material, and one or more voids encapsulated by the second conductive material such that the one or more voids have boundaries defined in part by portions of the second conductive material disposed between the one or more voids and the dielectric material. The portions of the second conductive material correspond to fuse links.

In accordance with yet another embodiment of the present invention, a semiconductor device including an electrically programmable fuse is provided. The device includes a substrate, a first electrode on the substrate, dielectric material on the first electrode, one or more second electrodes including a conductive material disposed on the first electrode between portions of the dielectric material, and one or more voids encapsulated by the conductive material such that the one or more voids have boundaries defined in part by portions of the conductive material corresponding to fuse links disposed between the one or more voids and the dielectric material.

In accordance with yet another embodiment of the present invention, a semiconductor device including an electrically programmable fuse is provided. The device includes a substrate, a first electrode on the substrate, dielectric material on the first electrode, one or more second electrodes including a conductive material disposed on the first electrode between portions of the dielectric material, and one or more voids each having five sides and encapsulated by the conductive material such that the one or more voids have boundaries defined in part by portions of the conductive material corresponding to fuse links disposed between the one or more voids and the dielectric material.

In accordance with yet another embodiment of the present invention, a semiconductor device including an electrically programmable fuse is provided. The device includes a substrate, a first electrode on the substrate, dielectric material on the first electrode, one or more second electrodes including a conductive material disposed on the first electrode between portions of the dielectric material, and one or more voids encapsulated by the conductive material such that the one or more voids have boundaries defined in part by portions of the conductive material corresponding to fuse links having thicknesses of less than about 5 nm disposed between the one or more voids and the dielectric material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
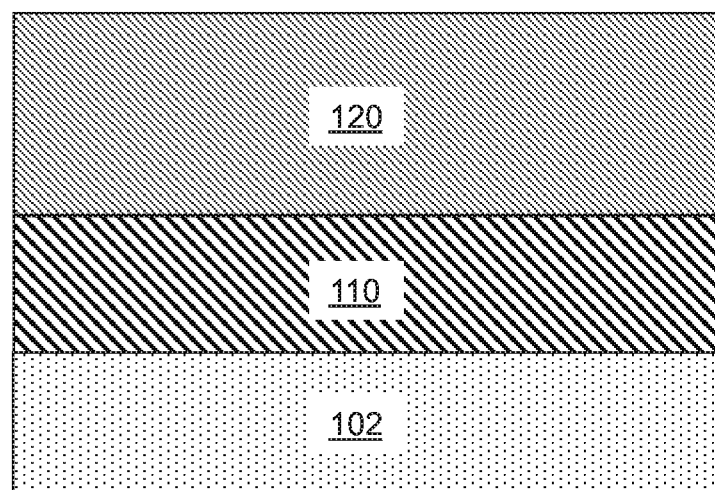
FIG. 1 is a cross-sectional view of the formation of a metal layer and dielectric material during the fabrication of an electrically programmable fuse of a semiconductor device, in accordance with an embodiment of the present invention.

The embodiments described herein provide for electrically programmable fuses, or eFuses, formed using photolithography to pattern and fabricate thin or ultra-thin fuse links that are not limited by photolithographic minimal dimensions and can be blown using a relatively small amount of current. Thus, the eFuses described herein take up less chip space and power, and are desirable for technology node devices using low driving current. The embodiments described herein are compatible with back-end-of-line BEOL processes without additional changes in materials, masks and manufacturing processes. Additionally, the eFuses described herein can be easily integrated with logic devices.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements, FIGS. 1-5 depict respective steps of a process flow for fabricating a semiconductor devices including an electrically programmable fuse (eFuse).

Referring now to FIG. 1, a cross-sectional view is provided showing an exemplary semiconductor device 100 having a substrate 102. The substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

As shown, a bottom electrode 110 including one or more layers of a conductive material is formed on the substrate 102 using any suitable process in accordance with the embodiments described herein. In one embodiment, the bottom electrode 110 is formed using a deposition process. The deposition process can include, for example, chemical vapor deposition (CVD), plasma enhanced chemical vapor deposition (PECVD), physical vapor deposition (PVD), sputtering, plating, chemical solution deposition and electroless plating. In one embodiment, the bottom electrode 110 includes a conductive metal material. For example, the bottom electrode 110 can include an elemental metal, an alloy of an elemental metal, a metal nitride, a metal silicide or combinations thereof including multilayers. In one embodiment, the bottom electrode 110 includes copper (Cu), tungsten (W), aluminum (Al), or combinations thereof. For example, the bottom electrode 110 can include an alloy such as, for example, an aluminum copper alloy (e.g., AlCu). In one embodiment, the bottom electrode 110 has a thickness from about 50 nm to about 2000 nm. In another embodiment, the bottom electrode 110 has a thickness from about 80 nm to about 500 nm. However, other thickness that are less than, or greater than, the aforementioned thickness ranges are also contemplated.

A dielectric capping layer (not shown) can be formed on an exposed surface (e.g., upper exposed surface) of the bottom electrode 110. In one embodiment, the dielectric capping layer includes a blanket layer of a dielectric capping material. The dielectric capping layer can include any suitable dielectric capping material such as, for example, SiC, $Si_3N_4$, $SiO_2$, a carbon doped oxide, a nitrogen and hydrogen doped silicon carbide SiC(N,H) or multilayers thereof. The blanket layer of the dielectric capping material can be formed utilizing a conventional deposition process such as, for example, CVD, PECVD, and spin-on coating. In one embodiment, the dielectric capping layer has a thickness of from about 10 nm to about 50 nm. In another embodiment, the dielectric capping layer has a thickness from about 25 nm to about 40 nm. However, other thickness that are less than, or greater than, the aforementioned thickness ranges are also contemplated.

As further shown, dielectric material 120 is formed. The dielectric material 120 can include a blanket layer of a dielectric material deposited utilizing any conventional deposition process including, for example, chemical vapor deposition (CVD), plasma enhanced chemical vapor deposition (PECVD), evaporation, chemical solution deposition and spin-on coating The dielectric material 120 includes any interlevel or intralevel dielectric material including inorganic dielectrics or organic dielectrics. In one embodiment, the dielectric material 120 is porous. In another embodiment, the dielectric material 120 is non-porous. In yet another embodiment, the dielectric layer 120 includes at least one porous region and at least one non-porous region. Some examples of suitable dielectrics that can be used to form the dielectric material 120 include, but are not limited to, $SiO_2$, silsesquioxanes, C doped oxides, etc. In one embodiment, the dielectric material 120 has a thickness from about 200 nm to about 400 nm. However, other thicknesses that are less than, or greater than, the aforementioned thickness ranges are also contemplated.

Although not shown, the device 100 can include other structures formed on the substrate 102. For example, the device 100 can include isolation structures, transistor devices, metal interconnects, etc.

Figure 2:
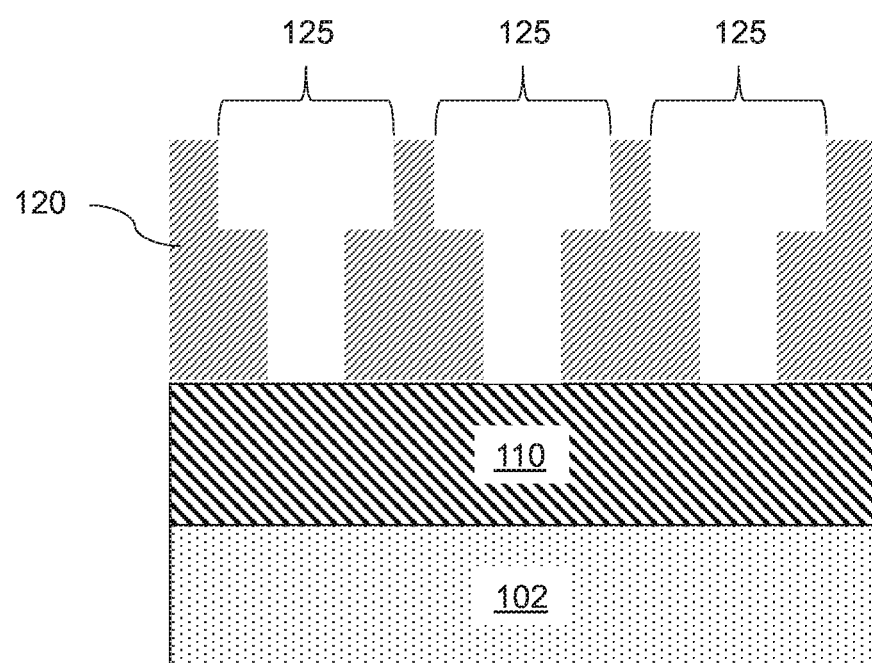
FIG. 2 is a cross-sectional view of patterning of the dielectric material performed during the fabrication of the electrically programmable fuse of the semiconductor device, in accordance with an embodiment of the present invention.

Referring to FIG. 2, the dielectric material 120 is patterned to create openings 125. In one embodiment, the openings 125 include via openings and line openings. It is observed that while FIG. 2 illustrates the formation of a single via opening and a single line opening, in other embodiments, a plurality of via openings and a plurality of line openings can be formed.

The structure shown in FIG. 2 can be fabricated utilizing any suitable techniques. In one embodiment, the openings 125 can be formed during a back-end-of-line (BEOL) process. For example, a BEOL dual damascene process can be used to form the via openings and line openings in the dielectric material 120. In one embodiment, the BEOL dual damascene process includes forming the line opening (top) and then forming the via opening (bottom). In another embodiment, the BEOL dual damascene process includes forming the via opening (bottom) and then the line opening (top). The width of the via opening (bottom) can be from about 10 nm to about 500 nm. More specifically, the width of the via opening (bottom) can be from about 25 nm to about 100 nm. The width of the line opening (top) can be from, e.g., about 25 nm to about 1000 nm. More specifically, the width of the line opening (top) can be from, e.g., about 50 nm to about 300 nm.

In one embodiment, a diffusion barrier (not shown) including one or more layers of a diffusion barrier material can be conformally formed on all exposed surfaces (e.g., horizontal and vertical) of the structures shown in FIG. 2. The diffusion barrier can include any suitable material that can serve as a diffusion barrier to prevent a conductive material from diffusing therethrough. For example, the diffusion barrier can include, e.g., tantalum (Ta), tantalum nitride (TaN), titanium (Ti), titanium nitride (TiN), ruthenium (Ru), ruthenium nitride (RuN), ruthenium-tatantalum (RuTa), ruthenium tantalum nitride (RuTaN), tungsten (W), a tungsten nitride (e.g., WN). Additionally, combinations of these materials can also be employed forming a multilayered stacked diffusion barrier. The diffusion barrier layer can be formed utilizing any suitable deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

Figure 3:
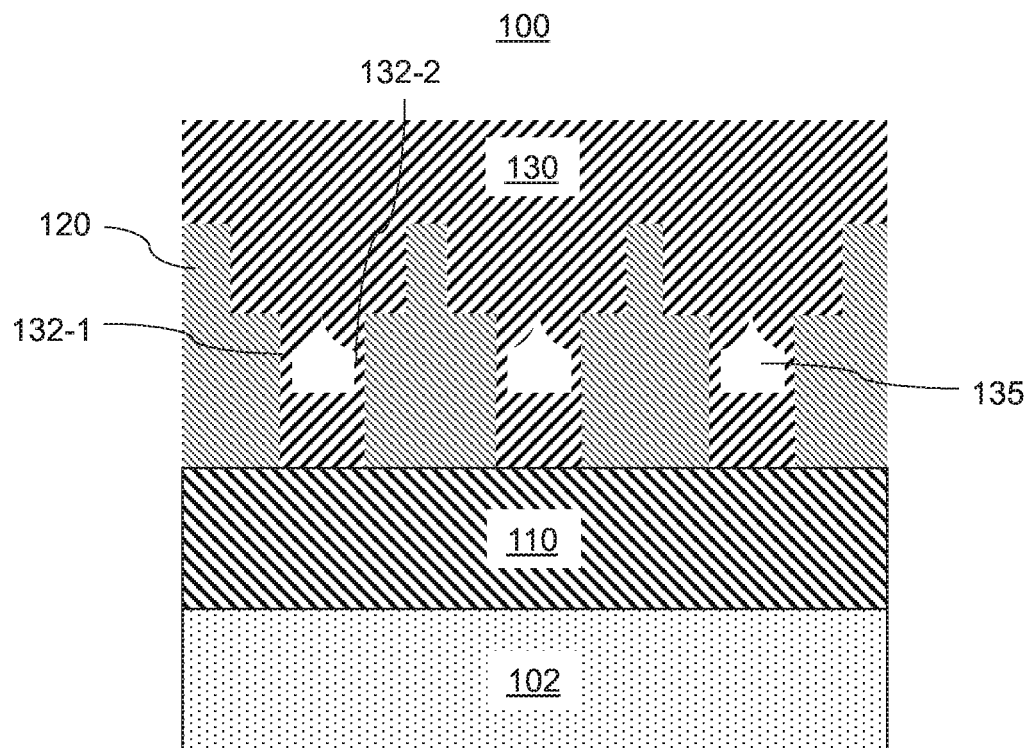
FIG. 3 is a cross-sectional view of non-conformal metal deposition and electroplating performed during the fabrication of the electrically programmable fuse of the semiconductor device, in accordance with an embodiment of the present invention

Referring to FIG. 3, second conductive material 130 is formed within the openings 125. The conductive material 130 can include any suitable material in accordance with the embodiments described herein. As shown, forming the conductive material 130 includes forming empty spaces or voids 135 encapsulated by the conductive material 130 such that the voids 130 have boundaries defined in part by portions of the conductive material 130 located between the voids 135 and the dielectric material 120, including portions 132-1 and 132-2. In this illustrative embodiment, the voids are shown having five sides. However, the voids can be formed having any suitable shape in accordance with the embodiments described herein.

The portions of the conductive material 130, including portions 132-1 and 132-2, correspond to fuse links having substantially uniform thicknesses. For example, in one embodiment, the fuse links have substantially uniform thicknesses of less than about 20 nm. In another embodiment, the fuse links have substantially uniform thicknesses of less than about 5 nm. In yet another embodiment, the fuse links have substantially uniform thicknesses of less than about 2 nm. Accordingly, the fuse links can be thin fuse links or ultra-thin fuse links. As shown, the device 100 includes multiple fuse links which can provide more programming capabilities.

The conductive material 130 can include at least one of copper (Cu), aluminum (Al), a copper aluminide (e.g., CuAl), tungsten (W), cobalt (Co), titanium (Ti), tantalum (Ta) and ruthenium (Ru). The formation of the conductive layer 130 can create empty spaces or voids 135.

In one embodiment, the conductive material 130 is formed by non-conformally depositing the conductive material 130 on the surfaces (e.g., bottom and sidewalls) of the dielectric material 120 within the openings 125. In non-conformal deposition, the deposition of material on the bottom/sidewalls of a structure is faster than the deposition of the material along the sidewalls/bottom of the structure. The non-conformal deposition of the conductive material 130 along the walls of the dielectric material 120 formed by the openings 120 can form the voids 135 as the conductive material 130 "pinches off" at the top of each of the voids 135. Further details regarding the formation of the conductive material 130 are described below with reference to FIG. 8.

For example, as is known in the art, due to their anisotropic and directional nature, such physical vapor deposition (PVD) techniques can result in non-conformal deposition. Examples of PVD techniques include, but are not limited to, evaporation, ion plating, and various sputtering techniques, such as DC and/or RF plasma sputtering, bias sputtering, magnetron sputtering, or Ionized Metal Plasma (IMP) sputtering.

In another embodiment, the conductive material 130 can be formed over sacrificial or dummy structures (not shown) having a desired shape of the voids 130, and processing can be performed to remove the sacrificial structures after the conductive material 130 is deposited to form the voids 130 and the portions of the conductive material (e.g., portions 132-1 and 132-2). For example, the conductive material 130 can encapsulate the sacrificial structures, subsequent access to remove the sacrificial structures can be provided, and the conductive material 130 can be restored after removing the sacrificial structures.

However, any suitable process can be used to form the second conductive material to form the one or more voids in accordance with the embodiments described herein.

It should be understood and appreciated that a certain amount of control can be needed in order to form the conductive material 130 such that the voids 135 can be formed having boundaries defined in part by portions of the second conductive material (e.g., portions 132-1 and 132-2) disposed between the voids 135 and the dielectric material 120 (e.g., such that the fuse links corresponding to the portions of the conductive material 130 have substantially uniform thicknesses). For example, in the case of a deposition process for forming the conductive material 130, deposition rates, deposition materials, etc. can be selected/controlled to create fuse links having suitable and uniform thicknesses.

Figure 4:
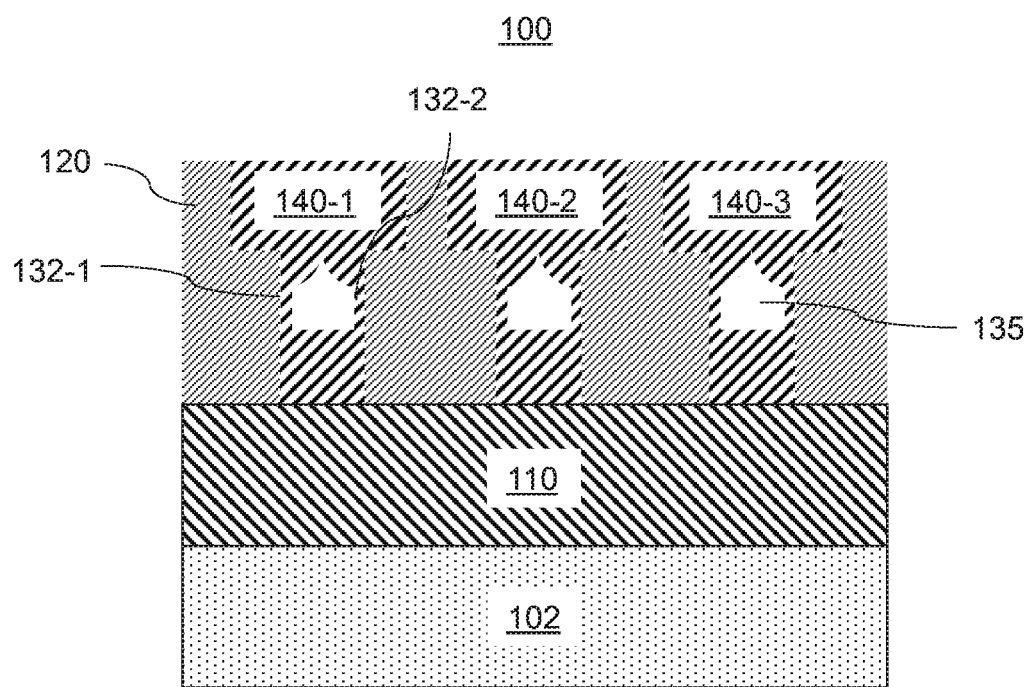
FIG. 4 is a cross-sectional view of planarization performed during the fabrication of the electrically programmable fuse of the semiconductor device, in accordance with an embodiment of the present invention.

Referring to FIG. 4, the conductive material 130 is planarized to be level with the dielectric material 120, resulting in top electrodes 140-1, 140-2 and 140-3. In one embodiment, planarizing the conductive material 130 includes performing chemical-mechanical planarization (CMP). However, any suitable process can be used to planarize the conductive material 130 in accordance with the embodiments described herein.

Figure 5:
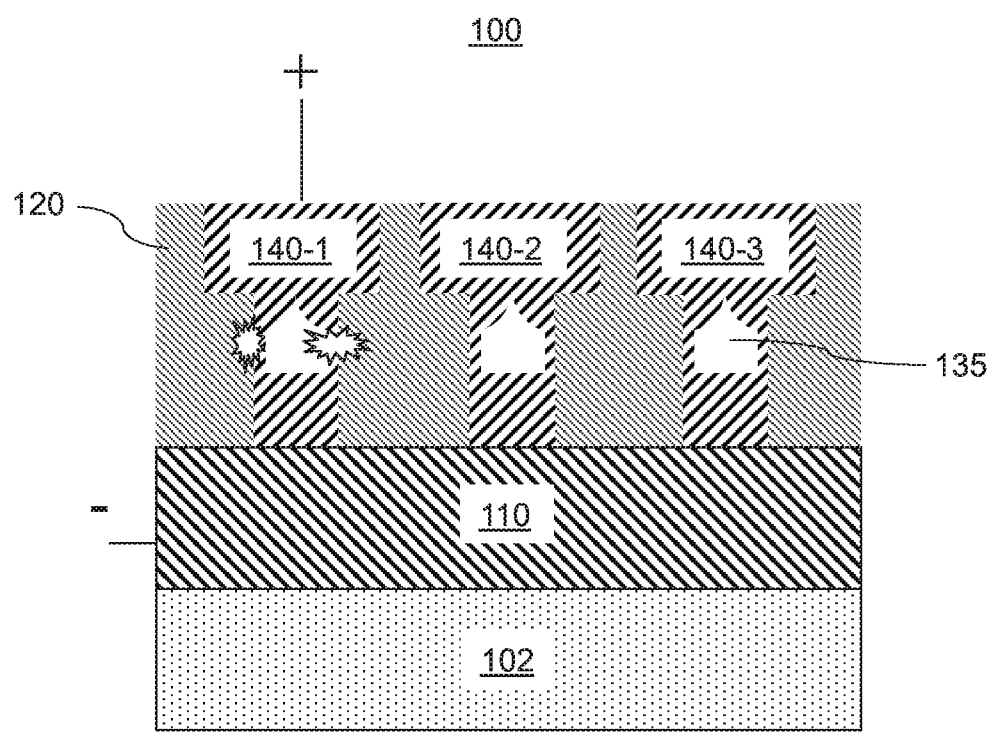
FIG. 5 is a cross-sectional view illustrating post programming of the electrically programmable fuse of the semiconductor device, in accordance with an embodiment of the present invention.

Referring to FIG. 5, in this illustrative embodiment, a current is applied between the bottom electrode 110 and the top electrode 140-1 to "burn out" the fuse links corresponding to the portions 132-1 and 132-2. Applying the current to the bottom electrode 110 and the top electrode 140-1 to "burn out" the fuse links corresponding to the portions 132-1 and 132-2 breaks down the connection between the bottom electrode 110 and the top electrode 140-1, thereby programming the device 100. Accordingly, the thin fuse links formed in accordance with the embodiments described herein correspond to electrically programmable fuses for electrically programming semiconductor devices.

Figure 6:
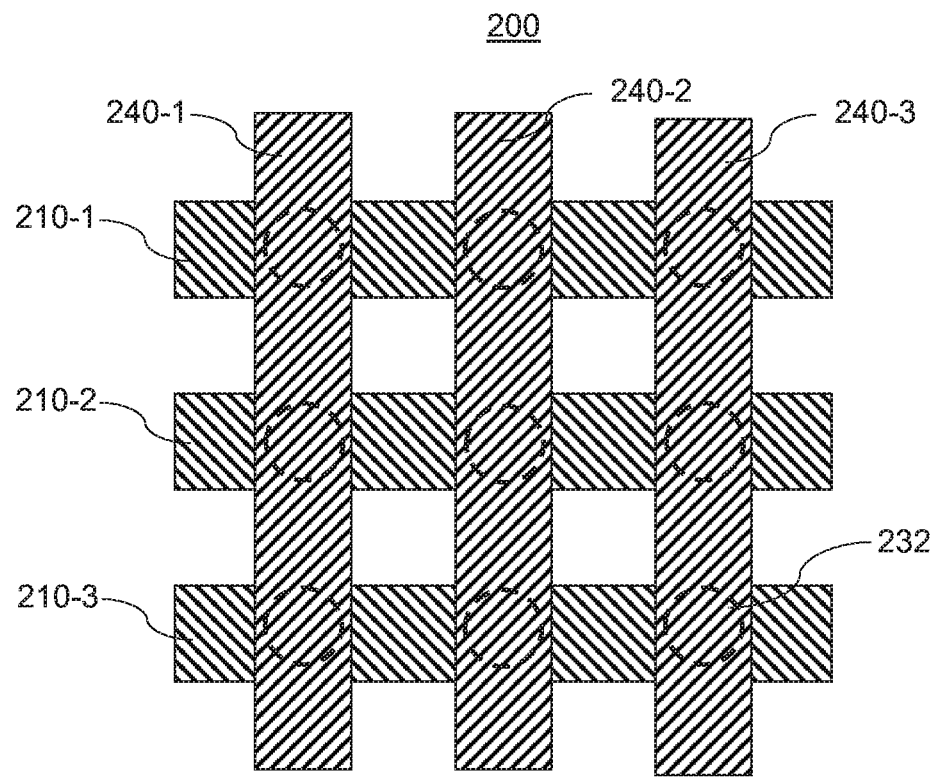
FIG. 6 is a top-down view of a semiconductor device, in accordance with an embodiment of the present invention.

Referring to FIG. 6, a top-down view of a semiconductor device 200 is provided. As shown in this illustrative embodiment, the device 200 includes a plurality of bottom electrodes, including bottom electrodes 210-1, 210-2 and 210-3. The device 200 further includes a plurality of top electrodes, including top electrodes 240-1, 240-2 and 240-3. However, the number of bottom electrodes and top electrodes should not be considered limiting.

The device 200 further includes a plurality of fuses located at the intersections between the bottom electrodes 210-1 through 210-3 and the top electrodes 240-1 through 240-3. For example, a fuse 232 is shown located at the intersection between the bottom electrode 210-3 and the top electrode 240-3.

Although not shown, it is assumed that the device 200 includes a substrate 200 of which the components of the device 200 are formed upon. Further details regarding the substrate, the bottom electrodes 210-1 through 210-3 and the top electrodes 240-1 through 240-3 are described herein above with reference to FIGS. 1-5.

Figure 7:
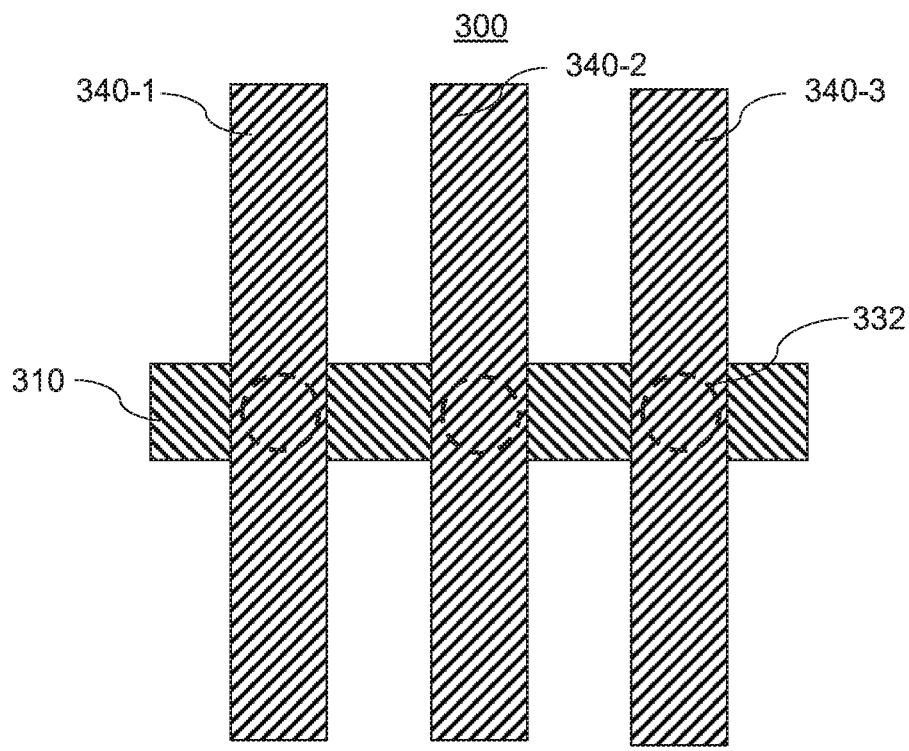
FIG. 7 is a top-down view of a semiconductor device, in accordance with another embodiment of the present invention.

Referring to FIG. 7, a top-down view of a semiconductor device 300 is provided. As shown in this illustrative embodiment, and unlike the device described above with reference to FIG. 2, the device 300 includes a single bottom electrode 310. The device 300 further includes a plurality of top electrodes, including top electrodes 340-1, 340-2 and 340-3. However, the number of bottom electrodes and top electrodes should not be considered limiting.

The device 300 further includes a plurality of fuses located at the intersections between the bottom electrodes 310 and the top electrodes 340-1 through 340-3. For example, a fuse 332 is shown located at the intersection between the bottom electrode 310 and the top electrode 340-3.

Although not shown, it is assumed that the device 300 includes a substrate 300 of which the components of the device 300 are formed upon. Further details regarding the substrate, the bottom electrodes 310 and the top electrodes 340-1 through 340-3 are described herein above with reference to FIGS. 1-5.

Figure 8:
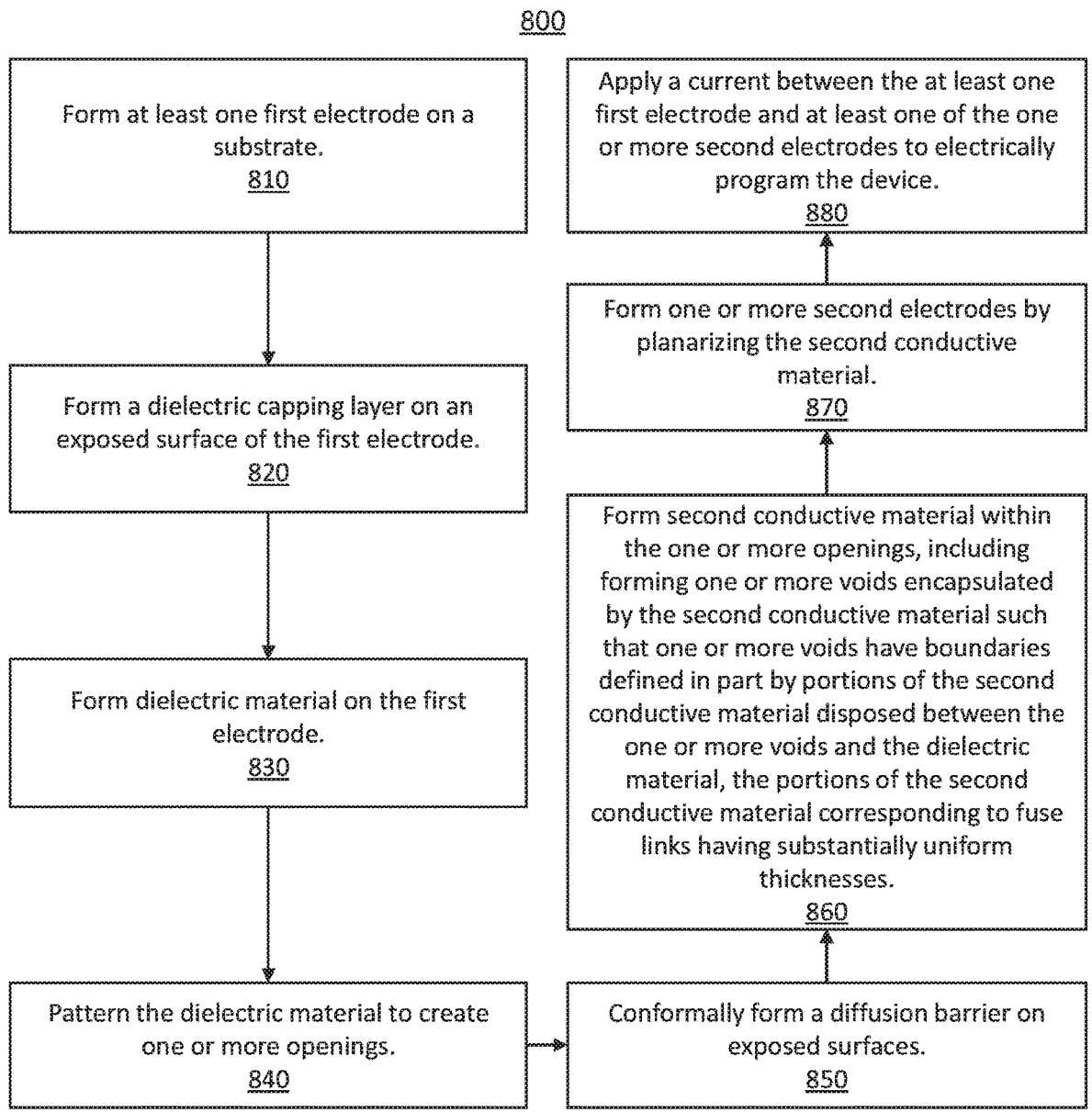
FIG. 8 is a block/flow diagram illustrating an exemplary process for fabricating a semiconductor device including electrically programmable fuses, in accordance with an embodiment of the present invention.

Referring to FIG. 8, a block/flow diagram is provided illustrating an exemplary process 800 for fabricating a semiconductor device including electrically programmable fuses.

At block 810, at least one first electrode is formed on a substrate. The at least one first electrode can include a first conductive material. The first conductive material can include one or more layers of conductive material formed using any suitable process in accordance with the embodiments described herein. In one embodiment, the at least one first electrode is formed using a deposition process. The deposition process can include, for example, CVD, PECVD, PVD, sputtering, plating, chemical solution deposition and electroless plating. In one embodiment, the at least one first electrode includes a conductive metal material. For example, the at least one first electrode can include an elemental metal, an alloy of an elemental metal, a metal nitride, a metal silicide or combinations thereof including multilayers. In one embodiment, the at least one first electrode includes Cu, W, Al, or combinations thereof. For example, the at least one first electrode can include an alloy such as, for example, AlCu.

At block 820, a dielectric capping layer can be formed on an exposed surface of the first electrode. In one embodiment, the dielectric capping layer includes a blanket layer of a dielectric capping material. The dielectric capping layer can include any suitable dielectric capping material such as, for example, SiC, $Si_4NH_3$, $SiO_2$, a carbon doped oxide, a nitrogen and hydrogen doped silicon carbide SiC(N,H) or multilayers thereof. The blanket layer of the dielectric capping material can be formed utilizing a conventional deposition process such as, for example, CVD, PECVD, and spin-on coating.

At block 830, dielectric material is formed on the first electrode. The dielectric material can include a blanket layer of a dielectric material deposited utilizing any conventional deposition process including, for example, CVD, PECVD, evaporation, chemical solution deposition and spin-on coating The dielectric material includes any interlevel or intralevel dielectric material including inorganic dielectrics or organic dielectrics. In one embodiment, the dielectric material is porous. In another embodiment, the dielectric material is non-porous. In yet another embodiment, the dielectric material includes at least one porous region and at least one non-porous region. Some examples of suitable dielectrics that can be used to form the dielectric material include, but are not limited to, $SiO_2$, silsesquioxanes, C doped oxides, etc.

At block 840, the dielectric material is patterned to create one or more openings. Any suitable techniques can be utilized to pattern the dielectric material to create the one or more openings. In one embodiment, the one or more openings can be formed during a back-end-of-line (BEOL) process. For example, a BEOL dual damascene process can be used to form the via openings and line openings in the dielectric material. In one embodiment, the BEOL dual damascene process includes forming the line opening (top) and then forming the via opening (bottom). In another embodiment, the BEOL dual damascene process includes forming the via opening (bottom) and then the line opening (top).

At block 850, a diffusion barrier can be conformally formed on exposed surfaces (e.g., horizontal and vertical). The diffusion barrier can include one or more layers of a diffusion barrier material. The diffusion barrier can include any suitable material that can serve as a diffusion barrier to prevent a conductive material from diffusing therethrough. The diffusion barrier can include, e.g., Ta, TaN, Ti, TiN, Ru, RuN, RuTa, RuTaN, W, WN. Additionally, combinations of these materials can also be employed forming a multilayered stacked diffusion barrier. The diffusion barrier layer can be formed utilizing any suitable deposition process such as, e.g., ALD, CVD, PECVD, PVD, sputtering, chemical solution deposition, or plating.

At block 860, second conductive material is formed within the one or more openings. Forming the second conductive material includes forming one or more voids encapsulated by the second conductive material such that the one or more voids have boundaries defined in part by portions of the second conductive material disposed between the one or more voids and the dielectric material. The portions of the second conductive material correspond to fuse links having substantially uniform thicknesses. In one embodiment, the fuse links have a thickness of less than about 5 nm. In another embodiment, the fuse links have a thickness of less than about 2 nm. Accordingly, the fuse links can be thin or ultra-thin fuse links. The second conductive material can include any suitable material in accordance with the embodiments described herein. For example, the second conductive material can include at least one of Cu, Al, CuAl, W, Co, Ti, Ta and Ru.

In one embodiment, the second conductive material can be formed by non-conformally depositing the second conductive material on the surfaces (e.g., bottom and sidewalls) of the dielectric material within the one or more openings. In non-conformal deposition, the deposition of the material on the bottom/sidewalls of a structure is faster than the deposition of the material along the sidewalls/bottom of the structure. The non-conformal deposition of the second conductive material can form the one or more voids, and the portions of the second conductive material corresponding to the fuse links, as the second conductive material "pinches off" at the top of each void.

For example, as is known in the art, due to their anisotropic and directional nature, such PVD techniques can result in non-conformal deposition. Examples of PVD techniques that can be used in accordance with the embodiments described herein include, but are not limited to, evaporation, ion plating, and various sputtering techniques, such as DC and/or RF plasma sputtering, bias sputtering, magnetron sputtering, or IMP sputtering.

In another embodiment, the second conductive material can be formed using conformal deposition (e.g., by using CVD). The conformal deposition of the second conductive material can form the one or more voids, and the portions of the second conductive material corresponding to the fuse links, as the second conductive material "pinches off" at the top of each void.

In yet another embodiment, the second conductive material can be formed over one or more sacrificial or dummy structures having a desired shape of the one or more voids, and processing can be performed to remove the sacrificial structures after the second conductive material is deposited to form the one or more voids and the portions of the second conductive material corresponding to the fuse links. For example, the second conductive material can encapsulate the one or more sacrificial structures, subsequent access to remove the one or more sacrificial structures can be provided, and the second conductive material can be restored after removing the one or more sacrificial structures.

In yet another embodiment, the second conductive material can be formed via electroplating.

However, any suitable process can be used to form the second conductive material within the one or more openings in accordance with the embodiments described herein.

It should be understood and appreciated that a certain amount of control can be needed in order to form the second conductive material such that one or more voids can be formed having boundaries defined in part by portions of the second conductive material disposed between the one or more voids and the dielectric material (e.g., such that the fuse links corresponding to the portions of second conductive material have substantially uniform thicknesses). For example, in the case of a deposition process for forming the second conductive material within the one or more openings, deposition rates, deposition materials, etc. can be selected/controlled to create fuse links having suitable and uniform thicknesses.

At block 870, one or more second electrodes corresponding to the one or more voids are created by planarizing the second conductive material. The second conductive material can be planarized to be level with the dielectric material. In one embodiment, planarizing the second conductive material includes performing CMP. However, any suitable process can be used to planarize the second conductive material in accordance with the embodiments described herein.

At block 880, a voltage can be applied to the at least one first electrode and at least one of the second electrodes to electrically program the device by "burning out" the fuse link corresponding to the at least one second electrode. Accordingly, the thin fuse links formed in accordance with the embodiments described herein correspond to electrically programmable fuses for electrically programming semiconductor devices.

Having described preferred embodiments of a semiconductor device and a method of fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device including an electrically programmable fuse, comprising:
   a substrate;
   a first electrode on the substrate;
   dielectric material on the first electrode;
   one or more second electrodes including a conductive material disposed on the first electrode between portions of the dielectric material; and
   one or more voids encapsulated by the conductive material such that the one or more voids have boundaries defined in part by portions of the conductive material corresponding to fuse links disposed between the one or more voids and the dielectric material.

2. The device of claim 1, wherein the first electrode includes at least one material selected from the group consisting of: copper (Cu), tungsten (W), and aluminum (Al).

3. The device of claim 2, wherein the first electrode includes an aluminum copper alloy.

4. The device of claim 1, wherein the first electrode has a thickness of from about 80 nm to about 500 nm.

5. The device of claim 1, wherein the dielectric material has a thickness from about 200 nm to about 400 nm.

6. The device of claim 1, further comprising a conformal diffusion barrier.

7. The device of claim 1, wherein at least one of the one or more second electrodes is electrically programmed.

8. A semiconductor device including an electrically programmable fuse, comprising:
   a substrate;
   a first electrode on the substrate;
   dielectric material on the first electrode;
   one or more second electrodes including a conductive material disposed on the first electrode between portions of the dielectric material; and
   one or more voids each having five sides and encapsulated by the conductive material such that the one or more voids have boundaries defined in part by portions of the conductive material corresponding to fuse links disposed between the one or more voids and the dielectric material.

9. The device of claim 8, wherein the first electrode includes at least one material selected from the group consisting of: copper (Cu), tungsten (W), and aluminum (Al).

10. The device of claim 9, wherein the first electrode includes an aluminum copper alloy.

11. The device of claim 8, wherein the first electrode has a thickness from about 80 nm to about 500 nm.

12. The device of claim 8, wherein the dielectric material has a thickness from about 200 nm to about 400 nm.

13. The device of claim 8, further comprising a conformal diffusion barrier.

14. The device of claim 8, wherein at least one of the one or more second electrodes is electrically programmed.

15. A semiconductor device including an electrically programmable fuse, comprising:
   a substrate;
   a first electrode on the substrate;
   dielectric material on the first electrode;
   one or more second electrodes including a conductive material disposed on the first electrode between portions of the dielectric material; and
   one or more voids encapsulated by the conductive material such that the one or more voids have boundaries defined in part by portions of the conductive material corresponding to fuse links having thicknesses of less than about 5 nm disposed between the one or more voids and the dielectric material.

16. The device of claim 15, wherein the first electrode includes at least one material selected from the group consisting of: copper (Cu), tungsten (W), and aluminum (Al).

17. The device of claim 16, wherein the first electrode includes an aluminum copper alloy.

18. The device of claim 15, wherein the first electrode has a thickness of from about 80 nm to about 500 nm, and the dielectric material has a thickness from about 200 nm to about 400 nm.

19. The device of claim 15, further comprising a conformal diffusion barrier.

20. The device of claim 15, wherein at least one of the one or more second electrodes is electrically programmed.

* * * * *